ULTRAHIGH-FREQUENCY TUNABLE STRUCTURE AND CIRCUIT

Filed July 1, 1953 3 Sheets-Sheet 1

INVENTORS
Wen Yuan Pan &
David J. Carlson
BY H. C. Moulton
ATTORNEY

ULTRAHIGH-FREQUENCY TUNABLE STRUCTURE AND CIRCUIT

INVENTORS
Wen Yuan Pan &
David J. Carlson

BY H. O. Houston
ATTORNEY

INVENTORS
Wen Yuan Pan &
David J. Carlson

BY H. L. Huston
ATTORNEY

United States Patent Office 2,803,745

Patented Aug. 20, 1957

2,803,745

ULTRAHIGH-FREQUENCY TUNABLE STRUCTURE AND CIRCUIT

Wen Yuan Pan, Collingswood, and David J. Carlson, Haddon Heights, N. J., assignors to Radio Corporation of America, a corporation of Delaware Application July 1, 1953, Serial No. 365,504

17 Claims. (Cl. 250—20)

This invention relates generally to tuning systems for radio signal receiving apparatus and the like, and more particularly to variable capacitor type tuning systems which are adapted for relatively wide range high frequency tuning.

Recently the allocation of the frequency spectrum between 470 and 890 megacycles for broadcasting of television signals has enabled the assignment of some seventy additional television ultra-high frequency channels in addition to the twelve presently existing VHF television channels. Accordingly, existing television receiving systems which have been designed to receive the aforementioned twelve presently allocated television channels are incapable of receiving the radio frequency carrier waves transmitted on the ultra-high frequency channels. Circuit modification or an additional converter circuit designed to receive the ultra-high frequency carrier waves are, therefore, required to enable reception of the ultra-high frequency channels. Such modification should include means for converting the ultra-high frequency carrier wave into a lower frequency carrier wave which can be accepted by a conventional very high frequency television receiver.

For any television broadcast receiver adapted to receive signals within the new ultra-high frequency television band, a tunable band pass input circuit is required which may be provided between the antenna and the first radio frequency amplifier, or if no radio frequency amplifier is provided, between the antenna and the mixer stage. Such a band pass input circuit or filter structure should have a high Q even at high frequencies, where Q indicates a figure of merit which is sometimes called the magnetization factor and which may be designed as the ratio of the energy stored by the resonant circuit or structure to the energy dissipated. Such a band pass input circuit structure should also have a constant bandwidth over its tuning range. Since the bandwidth depends essentially on the coupling factor, the structure should have a constant coupling factor over the tuning range. The band pass input circuit should also have a sharp cutoff outside of the pass band to minimize various spurious responses.

The present invention, therefore, relates to improvements in tuning structures useful in ultra-high frequency circuits such as in ultra-high frequency television converters and receivers. The conversion of ultra-high frequency (U.-H.-F.) signals to lower frequency (V.-H.-F.) signals, meets a present need for extending the utility of television signal receiving apparatus designed to receive only signals falling within the lower frequency (V.-H.-F.) band.

The incoming ultra-high frequency signal modulated carrier wave is selectively passed by the tunable band pass filter, and must be converted into a lower frequency signal modulated wave so that it may be coupled to a conventional very high frequency television receiver. To this end, the ultra-high frequency signal is generally heterodyned with a signal from a local oscillator to produce a very high frequency (V.-H.-F.) signal which may be coupled to the radio frequency portion of the television receiver. Another modification may operate to beat the ultra-high frequency signal with a local oscillator signal to provide a heterodyned signal of the proper frequency for coupling directly to the intermediate frequency section of the conventional V.-H.-F. television receiver.

To enable reception of all the U.-H.-F. channels, such conversion systems require that the local oscillator and antenna input circuit be tunable through a wide range of ultra-high frequencies. The oscillator and band pass input circuit should simultaneously be tunable across the frequency band in such a manner as to produce a constant difference or intermediate frequency. It is, therefore, necessary to provide tuning structures in which movement of the tuning control will simultaneously tune the oscillator and the antenna input circuit so that the tuned frequency of the circuits track each other as the system is tuned over the band of ultra-high frequencies from 470 to 890 megacycles.

Furthermore, for use in broadcast television receivers, an important consideration of the conversion system tuning structure is the adaptability of the tuning structure to mass production methods. Thus, the tuner should have a non-critical, low cost, simple structure which may be easily aligned and has an inherently good tracking relationship between the tuning response curves of the input circuit and the oscillator tuning sections.

The ultra-high frequency variable tuning structure of the invention utilizes a plurality of variable parallel-plate capacitors supported by a frame having a predetermined configuration, and connected for joint operation by a common control shaft. The gang capacitors of the invention are constructed to have the rotor plates mounted on the rotatable shaft, and conjugate stator plates mounted for cooperation with the rotor plates on an insulating member supported by the capacitor frame. Each of the plurality of sections of rotor and cooperating stator plates are separated by transverse metallic partitions or shielding walls. The various sections of the gang capacitor are connected for simultaneously tuning the ultra-high frequency oscillator and the receiver input circuits as described above.

In accordance with the invention, the receiver input circuit or band pass filter comprises certain sections of the variable tuning structure. In this case, one section of the structure is connected with the antenna to provide an input circuit for the filter while another section is connected with the mixer circuit to provide an output circuit. The tuning structure is modified to the extent that the distributed inductance of the frame in combination with the variable capacitor sections provides tunable resonant circuits for ultra-high frequency signals without the use of tuned lines and the like.

The bandwidth of such a structure depends essentially on the coupling factor between the two circuits and, therefore, it is desirable that the structure have a constant coupling factor over the tuning range. Coupling between the adjacent sections of the gang capacitor is accomplished by providing a pair of aligned elongated conductive bars extending transversely between the partition walls of the sections. It has been found that by properly positioning the elongated conductive bar relative to the gang capacitor frame, the coefficient of coupling between the two gang capacitor sections may be controlled to give a desired coupling factor over the tuning range.

Variable high frequency inductors and trimmer capacitors are provided for the input circuit sections so that adjustments may be made to insure accurate tracking of the band pass input circuit frequency with the oscillator frequency over a wide band of ultra-high frequencies. These inductors may be connected between a point on each of the elongated conductive bars and the respective capacitor stator plates.

Each of the high frequency variable inductors may comprise a strip of conductive material having an aperture at one end thereof for receiving a threaded member such as a screw. Each variable inductor is connected in the tunable circuit by providing a tapped terminal for the threaded member in the circuit (the elongated bar in the above example), and conductively connecting the free end of the metallic strip with a second terminal in the tunable circuit (a tuning capacitor stator element in the present example). The threaded member is surrounded by a spring that biases the metallic strip into positive electrical contact with the head of the threaded member. The inductance between the terminals is adjusted or varied by turning the screw into or out of the tapped terminal, thus providing a variable conductive distance (inductance) between the terminals.

The variable trimmer capacitors are effectively connected across each of the gang capacitor sections and are used in conjuction with the variable inductors described above and employed to accurately align the frequency response curves of the band pass input circuit and the oscillator circuit respectively. The tunable input circuit structure of the invention may readily be adjusted for tracking with the oscillator.

It is accordingly, a principal object of the present invention to provide an improved ultra-high frequency tuning structure for ultra-high frequency signal conveying circuits which is continuously tunable over a very wide portion of the ultra-high frequency range and which is relatively small in size and simple and compact in form, and easily reproducible with present mass production techniques.

A further object of the invention is to provide an improved ultra-high frequency tuning structure for ultra-high frequency signal circuits which may embody and effectively utilize conventional tuning elements such as variable parallel-plate capacitors as the variable tuning control elements thereof to cover a relatively wide ultra-high frequency range.

Another object of the invention is to provide a tunable ultra-high frequency filter structure tuned by a conventional parallel-plate type ganged capacitor and not using tuned transmission lines.

A further object of the invention is to provide an improved ultra-high frequency tuning structure for ultra-high frequency signal circuits which has parallel-plate type gang capacitors which are mounted on a unitary frame structure and are adapted to tune a plurality of circuits simultaneously and has means for providing optimum tracking between the frequency response curves circuits.

Another object of the invention is to provide an ultra-high frequency conversion system for converting ultra-high frequency carrier waves to lower frequency carrier waves which advantageously includes a simplified tuning structure in which a parallel plate type ganged capacitor having separate sections is provided for simultaneously tuning a plurality of different signal receiver circuits across a wide band of ultra-high frequencies.

A further object is to provide an improved compact and simplified ultra-high frequency tuning structure which may effectively operate with a conventional parallel-plate gang capacitor for continuous tuning through a wide range of ultra-high frequencies.

Another object of the invention is to provide an improved simple and inexpensive variable inductor for use at high frequencies, which is adapted to have a minimum of lead length.

The novel features which are considered characteristic of this invention are set forth with particularity in the appended claims. The invention itself, however, both as to its organization and method of operation as well as additional objects and advantages thereof, are best understood from the following description when read in connection with the accompanying drawings in which:

Figure 1:
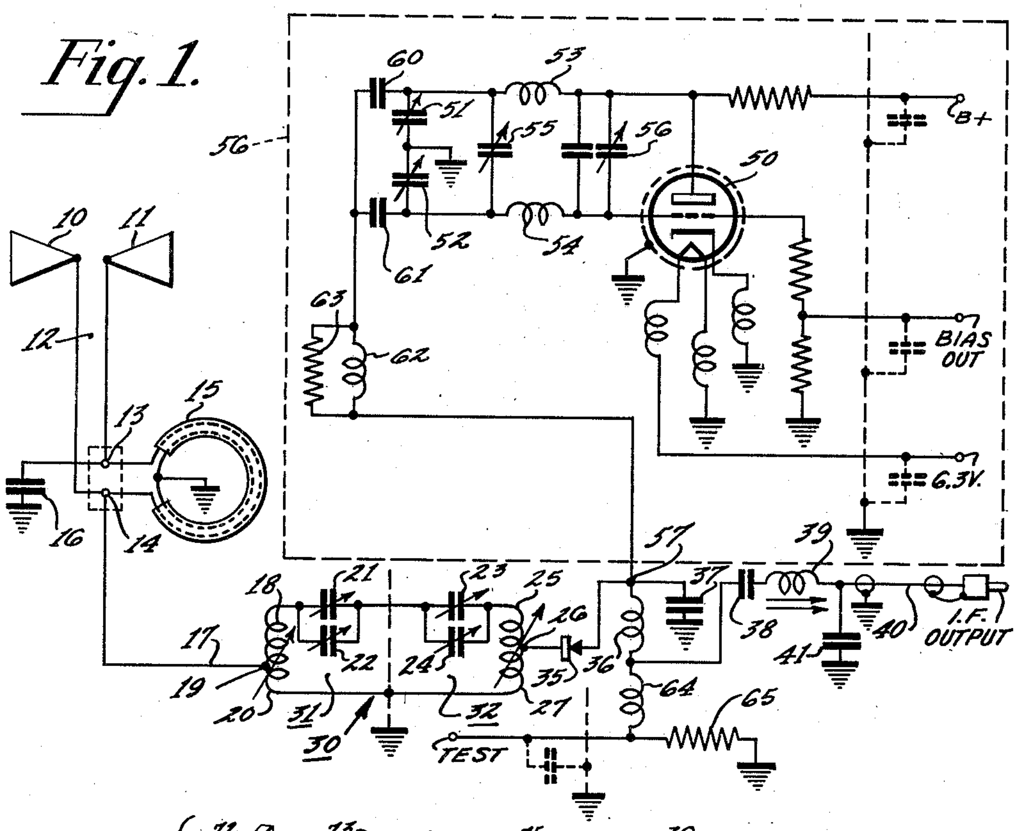
Figure 1 is a schematic circuit diagram of an ultra-high frequency television tuning system having a variable parallel-plate gang capacitor and inductor means in accordance with the invention for continuously tuning over a wide band of ultra-high frequencies.

Referring now to the drawings wherein like reference characters are used to designate like components or equivalents thereof, and particularly to Figure 1, an antenna 10, representing any conventional signal pickup means, is provided for receiving ultra-high frequency signals and may have a characteristic impedance of approximately 300 ohms in the present example. A conventional twin-conductor balanced transmission line 12 having good performance characteristics up to 900 megacycles and having an impedance of 300 ohms to match the impedance of the antenna is connected between the antenna 10 and the antenna input terminals 13, 14 to conduct the received signals from the antenna to the receiver input.

The terminals 13, 14 are connected with the tuner input through conductor 17. Engineering experience indicates that ultra-high frequency equipment is most efficiently and effectively designed with an unbalanced type of input circuit of relatively low impedance. This requires the construction of relatively wide band input circuit coupling or balun networks which provide an impedance match between the balanced antenna terminals and the unbalanced tuner input circuit. Accordingly, a balun or antenna coupling circuit comprising a short section of transmission line 15 and a capacitor 16 is provided for properly coupling the signals from the balanced 300 ohm impedance of line 14 to the unbalanced 75 ohm impedance of the tuner input.

The section of transmission line 15 which acts as substantially a half-wave balun is bent into a substantially circular configuration and has the opposite ends of one conductor respectively connected to the antenna terminals 13 and 14. The other conductor of the transmission line 15 has the opposite ends thereof connected together and to a point of fixed reference potential or ground. The length of transmission line 15 may be considerably reduced by the addition of capacitor 16 across the terminals of the section of transmission line such as between the antenna terminal 13 and ground. Capacitor 16 also broadens the frequency response of the antenna coupling circuit so that a wider band of ultra-high frequencies may be conveyed therethrough.

The ultra-high frequency signals are conducted from the antenna terminals to the tuner input by a conductor 17. In actual practice the conductor 17 is made as short as possible to avoid the inductive losses which are a major consideration in ultra-high frequency work. The tuner band pass input circuit 30, which is comprised of a pair of coupled frequency selective circuits 31 and 32, may be tuned to the frequency of the desired incoming signal, for conveying such signal to the mixer 35. Each of the selective circuits 31, 32 are comprised of a parallel combination of variable capacitors 21 and 23 and inductors 18 and 25. The variable capacitors 21 and 23 each comprise a section of a multi-section parallel-plate type gang capacitor and provides the tuning elements for the circuits 31 and 32. The physical structure of the capacitor and its frame which form parallel resonant circuits 31 and 32 will be described in greater detail hereinafter.

Conductor 17 is connected with the terminal 19 which is connected with the junction of inductors 20 and 18.

A pair of trimmer capacitors 22 and 24 are respectively connected across the terminals of the gang capacitor sections 21 and 23, and as will hereinafter be described, the variable inductors 18 and 25 and trimmer capacitors 22 and 24 are adjusted to align the band pass input circuit so that the frequency to which the input circuit is tuned will track the oscillator as the capacity of the gang capacitor is varied.

A non-linear signal mixing or combining means 35 is connected to the input circuit 32 by way of a terminal 26 at the junction of inductors 27 and 25. The impedance between terminal 26 and ground is designed to substantially match the impedance of the crystal diode mixer 35. The other terminal of the diode 35 is connected to an output terminal 57 of some form of oscillator circuit.

The type of oscillator circuit employed in the practice of the present invention is not important. The one shown in Figure 1 being merely illustrative of one type of oscillator circuit finding conventional application to the particular mixer shown. By way of example, the oscillator tube 50 is connected in a modified Colpits circuit.

A pair of series tuned circuits comprising an inductor 54 and a variable capacitor 52, and an inductor 53 and a variable capacitor 51 respectively, are connected between the grid and anode of oscillator tube 50 and ground. Physically the variable capacitors 51 and 52 are sections of the parallel-plate gang capacitor and are the frequency determining elements of the oscillator circuit. Since the band pass input circuit capacitors 21 and 23, and the oscillator circuit capacitors 51 and 52 are ganged, the band pass input circuit and the oscillator circuit will be tuned simultaneously by different sections of the same gang capacitor. By proper adjustment of the circuit components the heterodyne or difference frequency between the two circuits tracks over the ultra-high frequency range.

A pair of capacitors 55 and 56 are respectively connected between the two series circuits of the oscillator. The capacitor 55 is connected from the high side of capacitor 51, to the high side of the capacitor 52. Capacitor 56 is connected between the anode and grid of the oscillator tube 50. These capacitors provide adjustment for determining the limits for the useful frequency range of the oscillator circuit.

A pair of capacitors 60 and 61 which have a common terminal are connected respectively with the high signal potential terminal of the gang capacitors 51 and 52. The primary function of the capacitors 60 and 61 is to provide an isolation circuit so that the tuning of the oscillator circuit will not be effected by the injection circuit; however, the combination of capacitors 51, 52, 60, 61 form a bridge network across which the osciIaltor output is taken. To this end the capacitors 60 and 61 are unbalanced and have unequal capacitance so that a predetermined output taken from between their common junction and ground to provide a desired amount of oscillator excitation for the mixer diode 35.

Dotted line 56 may indicate a metallic shield for the oscillator components within the area. Grounding the shield 56 improves the effectiveness of the shield in reducing undesired radiation of oscillator energy. The signal modulated carrier wave conveyed through the band pass input circuit 30 is heterodyned with the signals from the local oscillator to produce a heterodyne or intermediate frequency signal.

The over-all pass band characteristic and the tuner noise factor is particularly effected by the heterodyned signal frequency impedance of the crystal diode. This impedance is a function of crystal excitation, and to some extent, it is also a function of other factors such as oscillator frequency. The variation of the mixer impedance modifies the loading on the frequency selective output circuit and in extreme cases may shift the output frequency pass band by a substantial amount. A capacitive impedance matching network is, therefore, employed to minimize this detuning effect. Experiments have shown that when mixer diodes are adjusted to have a given rectified current, the crystal excitation at an oscillator frequency of 900 megacycles seems to be considerably less than those at 500 megacycles. Thus, the oscillator injection circuits must be modified to insure uniform pass band characteristic and mixer operation. Accordingly, the oscillator injection circuit includes a low Q circuit comprising an inductance 62 and a parallel resistor 63 which are serially inserted in the oscillator injection lead and aid in making the crystal excitation substantially uniform throughout the entire frequency band.

The oscillator output signal is developed across a capacitor 37 which is connected between the mixer diode 35 and ground. The combination of the impedance provided by the capacitor 37 and the mixer diode will be such as to develop sufficient voltage for proper excitation of the mixer diode. The capacitor 37 also serves as a component of an impedance transformation network also including the capacitor 38 which is provided to properly match the mixer circuit with the receiver input circuit. The direct current return path for the mixer diode 35 is provided between series combination of inductor 36, inductor 64 and a resistance 65 which are connected between the mixer and ground.

The heterodyne frequency output signal from the diode mixer 35 is coupled to a very high frequency television receiver by means of a frequency selective circuit. As an example, it may be desirable to connect the ultra-high frequency tuner output directly with the intermediate frequency circuits of the receiver. In such case, the heterodyne frequency signal output from mixer 35 resulting from the mixing of the ultra-high frequency signal modulated carrier wave and the local oscillator should be 41–47 megacycles. The frequency selective circuit comprises capacitors 37 and 38, inductors 36 and 39, a capacitor 41, and the inherent distributed capacitance and inductance of the leads in the circuit and is tuned to the 41–47 megacycle intermediate frequency.

The frequency selective circuit including the capacitors 37, 38, and 41 and the inductor 39, in combination with the small inductor 36 form a low pass filter to prevent oscillator and ultra-high frequency signals from feeding into the intermediate frequency circuits of the receiver.

A test point is connected between the junction of the inductor 64 and the resistor 65 to check for proper mixer excitation. The voltage measurement between the test point and ground indicates the potential developed across resistor 65 by the rectified oscillator signal. It has been found that a measurement of one-tenth of a volt indicates that there is a mixer excitation of approximately 1000 microwatts.

Figure 2:
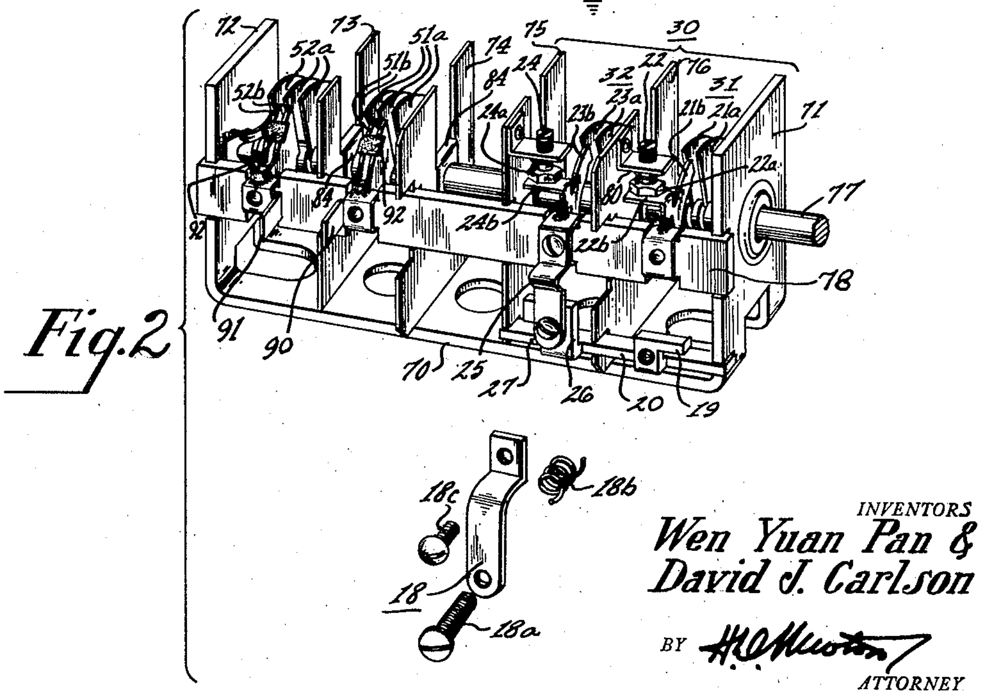
Figure 2 is a side view in perspective with a portion shown in exploded relation thereto, of a sectionalized gang capacitor tuning structure for use in the circuit of Figure 1 as a presently preferred embodiment of the invention.

Reference is now made to Figure 2 which is shown in perspective, the resonant structure including the conventional parallel-plate gang tuning capacitor constructed in accordance with the invention. The capacitor frame includes a conductive base member 70 and a pair of integral end sections 71 and 72 which are formed perpendicular to the base member. The space along the base section 70 is divided into a plurality of sections by conductive walls or partitions 73, 74, 75, 76 which are substantially parallel to the end sections of the capacitor frame and electrically connected with the base 70. An elongated member 78 constructed of insulating material is supported by the end plates and walls in spaced relation to and parallel with the base 70.

Several parallel plate type variable capacitors 21, 23, 51, 52 are located in successively aligned relation to each other along the base member and in different spaces formed by the conductive walls. Each of the capacitors are provided with rotor plates 21A, 23A, 51A, 52A, which are mounted on and conductively connected to a rotatable shaft 77. The shaft 77 is rotatably journaled in the end sections of the capacitor frame and are conductively connected with the walls 73, 74, 75, and 76 through the conductive wiper member 84. The stator plates 21B, 23B, 51B, 52B are mounted along the elongated insulating member 78 and are so disposed to mesh with the rotor plates in connection with the shaft 77.

The tuner band pass input circuit 30, is comprised of a pair of adjacent capacitors which together with the frame form the resonant sections 31 and 32. The unbalanced input from the antenna terminal 14 is connected through the conductor 17 to a point on the conductive or terminal tab 19 of the resonant section 31. The terminal 19 is mounted on an elongated conductive bar member 20 which is disposed in spaced relation to the base member 70 of the capacitor frame. The physical configurations of the elongated bar member 20 determine the amount of inductance provided between the tab 19 and ground. The base member 70 may be considered as a fixed point of reference potential.

Figure 5:
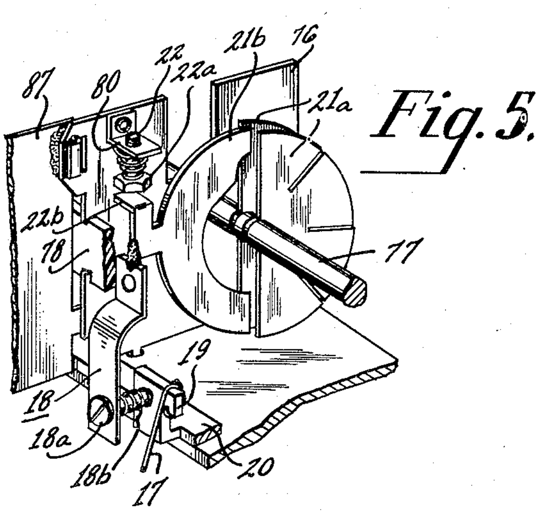
Figure 5 is a fregmentary view in perspective of a portion of the high frequency tuner of Figure 2 showing certain details of the circuit configuration thereof.

A variable inductance 18 which is shown exploded from the frame in Figure 2 and is also shown in Figure 5 is provided between the conductive terminal 19 and the terminal for the stator plate 21B. The inductor 18 comprises an elongated strip of conductive material one end of which may be securely fastened to the stator terminal on insulating support member 78 by a screw 18C. It is understood that in the method of fastening the terminals to the insulating member is not important. The other end of this strip has an aperture for receiving an elongated threaded member such as a screw 18A. The screw may be turned into a tapped hole in the terminal 19 to provide a conductive path having a predetermined desired length and hence inductance between the stator plate and terminal 19. A resilient means such as the spring 18B surrounds the screw to urge the conductive strip into continuous and dependable electrical contact with the head portion of the screw 18A. The inductance of inductor 18 may be increased by increasing the length of the strip 18 or the screw 18A or both, and the range of variation in inductance values is determined by the length of screw 18A.

The trimmer capacitor 22 which is effectively connected across the terminals of the parallel plate gang capacitor is connected between the conductive partition 76 and the stator plate 21B. A conductive member 80 projecting from and supported by the conductive wall 76 has a tapped hole for receiving a screw 22A. The head of the screw 22A in combination with a tab bent from the rear of the stator plate 21B form the plates of the variable trimmer capacitor 22.

The resonant section 32 is substantially the same as section 31 and the output from this section may be taken from the conductive terminal 26. A variable inductor 25 is shown constructed with a slightly different configuration than the inductor 18. However, both have substantially similar parts and operate in the same manner.

The frequency band width of the tuner input circuit depends upon the loading of each circuit and the coefficient of coupling between the circuits. The loading on section 31, for instance, is determined by (1) the impedance of the input coupling device shown in Figure 1 as the short section of transmission line 15 in combination with the capacitor 16, and (2) the configuration and relative position of the conductive elongated bar member 20 and 26 and the dimensions to the tapped hole of conductive terminal 19. Similarly, the loading on circuit section 32 is determined by (1) the impedance of the crystal or mixer diode 35, and (2) the configuration and relative position of the conductive elongated bar member 27 and the dimensions to the tapped hole of conductive terminal 26.

The position of the bar members 20 and 27 relative to the capacitor frame to a great extent control the coefficient of coupling between the circuit sections 31 and 32. The total coupling between the sections is believed to consist of a mutual inductance component which increases the percent of band width at lower frequencies, a capacitive component which increases the amount of coupling between the circuits at higher frequencies and a common impedance component resulting through the flow of currents through a common path such as the shaft and inner-sectional walls. The inductance, capacitance and common impedance components are determined by the mechanical configuration of the bar members 20, 27 and of the other gang capacitor parts. The complex coupling between the circuit sections 31 and 32 enables a tunable band pass filter structure constructed in accordance with the invention, to provide an average band width of about 9 megacycles when the signal frequency is 470 megacycles and about 14 megacycles when the signal frequency is 890 megacycles.

The parallel plate gang capacitor sections 51 and 52 are connected respectively with the ultra-high frequency oscillator circuit by way of terminals 90 and 91. The capacitor sections 51 and 52 are similar to those described hereinabove and have the rotor plates 51A and 52A conductively mounted on the rotatable shaft 77 and the stator plates 51B and 52B mounted on the elongated insulating member 78. More or fewer stator and rotor plates may be provided to obtain the desired capacity variations for tuning the oscillator circuit. The stator plates of each capacitor are electrically connected together as by the conductive members 92 which are placed at points removed from the terminals to prevent losses due to the long current paths between unequal potential points on adjacent stator plates.

It has been found that by leaving an empty capacitor section between the tuner input circuit and the oscillator tuning capacitors, such as the space defined by the walls 74 and 75, that there is a minimum of interaction between the two circuits. However, by properly isolating the circuits in other ways this precaution need not be taken.

Figure 4:
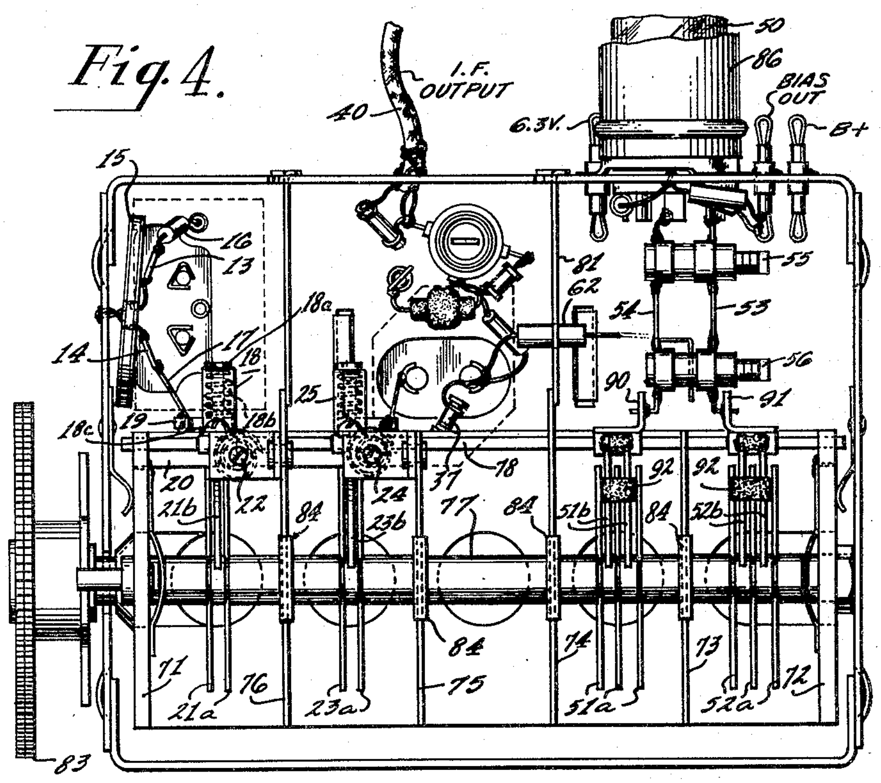
Figure 4 is a plan view of the ultra-high frequency tuner shown in Figure 3 with a cover element removed to show interior details of construction.
Figure 3:
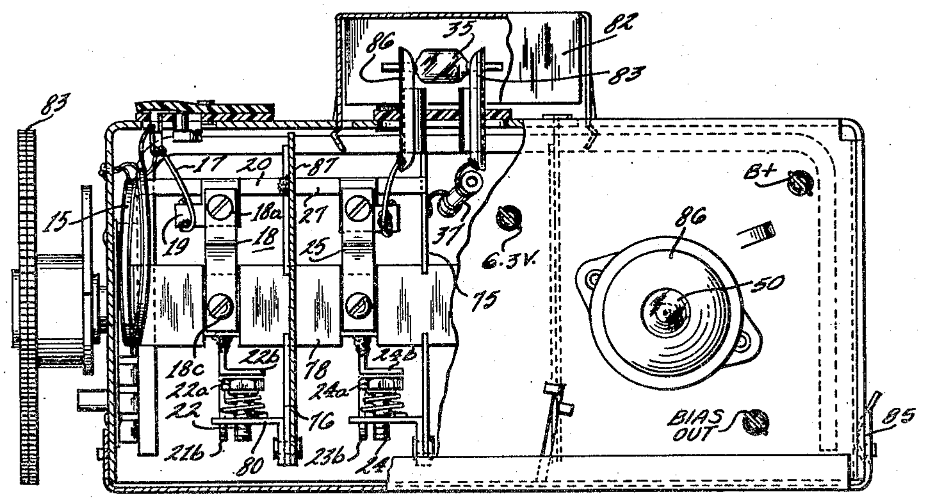
Figure 3 is a side view partly in cross section and with the outer wall elements partly broken away, of an ultra-high frequency tuner constructed in accordance with the invention and embodying the circuitry shown in Figure 1.

The Figures 3 and 4 show on an enlarged scale, elevation and plan views respectively of the physical construction of an ultra-high frequency tuner embodying a tuning structure constructed in accordance with the invention. The oscillator section of the tuner is constructed at the right end thereof and is shielded from the mixer and input circuits by a conductive shield member 81 which extends from the box-like chassis to the partition or wall 74 of the gang capacitor frame. The mixer and resonant section 32 of the tuning structure are shielded from the resonant section 31 of the tuning structure by a conductive shield member 80. The shielding member 80 is conductively connected with the wall 76 between the two resonant sections in such a manner that a small opening is maintained between the sections to provide a predetermined amount of capacitive coupling between the sections as hereinbefore mentioned. A cover 85 is provided to completely enclose the open end of the tuner so that radiation therefrom may be reduced to a minimum.

The tuner embodying the invention has been constructed to achieve maximum accessibility to the circuit components for adjustment and replacement of parts. The oscillator tube 50 is mounted outside the tuner chassis for easy removal and is surrounded by a conductive shield member 86 to prevent excessive radiation of the local oscillator signal. The crystal mixer 35 is mounted in a crystal holder having terminals 83 and 86. The crystal holder is constructed to have a minimum of capacitance between and a minimum of inductance in the terminals thereof. The terminals 83, and 86 of crystal holder conveniently project to the exterior of the tuner chassis to permit access to the crystal mixer 35. A cover 82 which clips on the tuner chassis is provided to protect the crystal 35 and to prevent oscillator radiation from the terminals of the crystal holder. Holes are punched in the chassis at predetermined locations to permit easy accessibility to the screwdriver adjustments such as the variable inductors 18 and 25, and the oscillator capacitors 55 and 56, and in the cover 85 to adjust trimmers 22 and 24.

The improved resonant structure of the invention permits simultaneously tuning the band pass input circuit and the oscillator without the use of space consuming quarter-wave lines. Such a tuning structure as described permits the construction of a rigid and compact ultra-high frequency tuner unit adapted to be installed with presently existing very high frequency television receivers to enable the reception of ultra-high frequency channels. Any number of tuning control systems may be provided to rotate the gear or knob 83 which is fastened to the rotatable shaft 77 of the gang capacitor to tune the structure through its frequency range.

Figure 6:
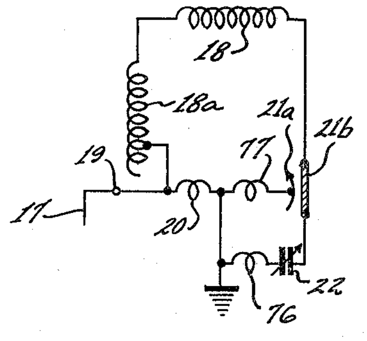
Figure 6 is an equivalent schematic circuit diagram of the circuit configuration of the structure shown in Figure 5.

Referring to Figures 5 and 6, the adjustments of the band pass tuning structure to enable accurate tracking of the oscillator frequency will now be described:

To track the tuner band pass input circuit with the oscillator circuit requires at least two independent adjustments. If the tuner is designed to receive the recently assigned ultra-high frequency television channels which operate from 470 to 890 megacycles the band pass input circuit should be aligned with the oscillator at 520 megacycles by means of the variable inductors 18 and 25. The tuner may be then aligned at 800 megacycles by an adjustment of the trimmer capacitors 22 and 24 which is an integral part of the gang capacitor. An adjustment of trimmer capacitors 22 and 24 modifies the minimum capacitance of variable capacitor sections thus affect the resonance of the circuit. The combination of the variable inductors 18 and 25 and the trimmer capacitors 22 and 24 forms the tracking device. The probable tracking error of a tuner constructed in accordance with the invention when such two point alignment is about 8 megacycles at 890 megacycles and about 3 at about 470 megacycles. To further reduce the tracking error the rotor plates are serrated or notched to permit second order alignments. When a tuner constructed in accordance with the invention is properly tracked including both first order alignments and second order alignments, the resulting tracking errors have been found to be less than 4 megacycles over the entire ultra-high frequency tuning range.

Figure 7:
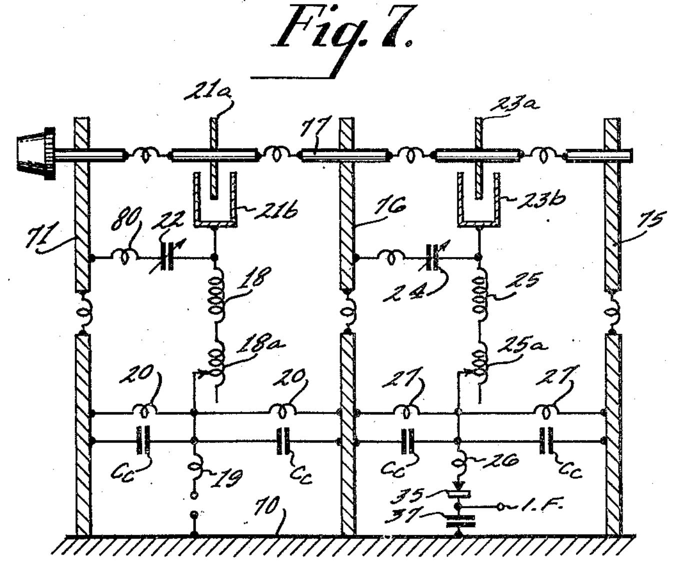
Figure 7 is an equivalent schematic circuit diagram of the two right-hand end sections of the tuning structure shown in Figure 2.

Figures 6 and 7 show equivalent schematic circuit diagrams of the tracking system and of the band pass input structure respectively. In ultra-high frequency work cognizance of even the most minute inductance values must be taken; hence, to construct an ultra-high frequency tuner which will efficiently and accurately perform the desired functions care must be taken to include inductance values of such elements as shielding partitions and tuning shafts and the like. Accordingly, in Figures 6 and 7 the parts of the tuning structure are characterized by their inductance or capacitance equivalent circuit values and are designated by the same reference character. Actually the inductance of the wall 71, 75, and 76 for instance, is distributed throughout the entire length. However, for convenience, the inductance of the wall is shown in Figure 7 as being lumped at a point along the wall, likewise as to the distributed inductance of the tuning shaft 77.

The improved, compact, highly efficient, ultra-high frequency tunable resonant structure described, which comprises parallel plate type gang capacitors having a frame of predetermined configuration has provided an effective and practical solution to the problem of wide range tuning in ultra-high frequency commercial signal receiving apparatus for quantity production such as television receivers, without resorting to complicated tuned lines or resonant cavities or the like.

What is claimed is:

1. An ultra-high frequency filter structure comprising, a frame including a conductive base member and parallel conductive walls transverse to and electrically connected with said base, a pair of parallel plate type variable capacitors each having terminal connection means located in shielded relation to each other in different spaces between said walls along said base member, a pair of conductive bar elements located in spaced relation to the base and extending between and connecting said walls, means providing a terminal connection on each of said conductive bar elements, inductance means connected between each of said last named terminal connection means and one of the terminal connection means of said variable capacitors, and means providing connections for the other terminals of said variable capacitors with said frame as a common terminal means therefor.

2. An ultra-high frequency filter structure comprising, a frame including a conductive base member and parallel conductive walls extending in contact with and transverse to said base, a pair of parallel plate type variable capacitors each having terminal connection means and disposed in different spaces between said conductive walls, a pair of conductive bar elements located in spaced relation to the base and extending between and connecting said walls, means providing a terminal connection on each of said conductive bar members, inductance means connected between each of said last named terminal means and a terminal connection of said variable capacitors, and means providing connections for the other terminals of said capacitors with said frame as a common terminal means therefor.

3. An ultra-high frequency filter comprising a frame including a conductive base member and at least one conductive wall extending in contact with and transverse to said base, a pair of parallel-plate type variable capacitors each having terminal connection means and disposed on opposite sides of said conductive wall, a conductive bar element located in spaced relation to the base and extending through and connected with said wall, means providing a pair of terminal connections on said conductive bar member, further means providing circuit connections between said terminal means and the terminal connection of said variable capacitors, and means providing connections for the other terminals of said capacitors with said frame as a common terminal means therefor.

4. A tunable resonant structure for ultra-high frequency signal currents comprising, a frame including a conductive base member and parallel conductive walls transverse to and electrically connected with said base, a pair of parallel plate type variable ganged capacitors each having rotor and stator plates located in shielded relation to each other in different spaces between said walls along said base member, a pair of elongated conductive bar elements located in spaced parallel relation to the base and extending between and connecting said walls, means providing a terminal connection on each of said conductive bar elements, inductance means connected between each of said last named terminal connection means and the stator plates of said variable capacitors, and means providing connections for the rotor plates of said variable capacitors with said frame as a common terminal means therefor.

5. An ultra-high frequency band pass filter structure comprising, a frame including a conductive base member and parallel conductive walls transverse to and electrically connected with said base, a pair of parallel plate type variable capacitors ganged together each having rotor and stator plates located in shielded relation to each other in different spaces between said walls along said base member, a pair of elongated conductive bar elements located in spaced parallel relation to the base and extending between and connecting said walls, means providing a terminal connection on each of said conductive bar elements, variable inductance means connected between each of said last named terminal connection means and said stator plates of said variable capacitors, means providing connections for the rotor plates of said variable capacitors with said frame as a common terminal means therefor, and further variable capacitance means effectively connected between said stator and rotor plates.

6. A tunable resonant filter structure for ultra-high frequency signal currents comprising, a frame including a conductive base member and parallel conductive walls transverse to and electrically connected with said base, a pair of ganged parallel plate type variable capacitors each having rotor and stator plates, said capacitors located in successively aligned relation to each other along said base member and in different adjacent spaces between said walls, an elongated conductive bar element located in spaced parallel relation to the base and extending through and connecting the walls of the adjacent sections, means providing a pair of terminal connections on said conductive bar element, a pair of variable inductance means connected between each of said last named terminal connection means and said stator plates of said respective variable capacitors, and means providing connections for the rotor plates of said variable capacitors with said frame as a common terminal means therefor.

7. A tunable resonant filter structure as defined in claim 6 wherein said variable inductance means comprises, an elongated strip of conductive material, one end of said conductive strip connected with said stator plate, the other end of said strip having an aperture for receiving an elongated member having a head portion, said elongated member connected electrically for axial movement with said means providing terminal connection to provide a variable conductive path from said stator plate to said terminal connection, and spring means surrounding said last named member for urging said conductive strip into contact with said head portion.

8. In a superheterodyne radio receiver adapted to receive selected signals in the ultra-high frequency range the combination with means for intercepting ultra-high frequency signals of, a tunable antenna input filter structure for selecting signals of a desired frequency comprising, a frame including a conductive base member and parallel conductive walls extending in contact with and transverse to said base, a pair of parallel plate type variable capacitors having rotor and stator plates, said capacitors disposed in different adjacent spaces between said conductive walls, conductive bar element located in spaced relation to the base and extending through and electrically connecting the walls of the adjacent spaces, means providing a pair of terminal connections on said conductive bar member, a pair of inductance means connected between each of said last named terminal means and the stator plate of said variable capacitors, means providing connection for the rotor plates of said capacitors with said frame as a common terminal means therefor, means connecting said intercepted ultra-high frequency signals with one of said terminal means, and utilization means connected with said other terminal.

9. In a superheterodyne radio receiver adapted to receive selected signals in the ultra-high frequency range, the combination with means for intercepting ultra-high frequency signals, of a tunable resonant structure comprising a conductive frame member having a base and a plurality of parallel walls transverse to and electrically connected with said base, a plurality of parallel plate type variable capacitors each having rotor and stator plates, said capacitors successively located in aligned relation to each other along said base member and disposed in different spaces between said conductive walls, a pair of elongated conductive bar elements located in spaced relation to the base and extending between and connecting the walls of a pair of adjacent spaces, means providing a terminal connection on each of said conductive bar elements, inductance means connected between each of said last named terminal connection means and the stator plates of a pair of said variable capacitors contained in the respective spaces, means providing connections for the rotor plates of said variable capacitors with said frame as a common terminal therefor, means connecting said intercepted ultra-high frequency signals with one of said terminals, means providing signal mixing means connected with the other of said terminals, oscillation means for generating a source of signals of a predetermined frequency connected with said mixer, whereby the intercepted ultra-high frequency signals are heterodyned with the oscillator signals from said source, and means connecting at least one of said parallel plate variable capacitors with said oscillator as a frequency determining means therefor, utilization means connected with said mixer.

10. In a superheterodyne receiver as defined in claim 9 a parallel plate type capacitor having serrated rotor plates.

11. In a superheterodyne receiver as defined in claim 9 a parallel plate type capacitor having serrated stator plates.

12. In a superheterodyne radio receiver adapted to receive selected signals in the ultra-high frequency range, the combination with means for intercepting ultra-high frequency signals, of a tunable resonant structure comprising a conductive frame member having a base and a plurality of parallel walls transverse to and electrically connected with said base, a plurality of parallel plate type variable capacitors each having rotor and stator plates, said capacitors successively located in aligned relation to each other along said base member and disposed in different spaces between said conductive walls, a pair of elongated conductive bar elements located in spaced relation to the base and extending between and connecting the walls of a pair of adjacent spaces, means providing a terminal connection on each of said conductive bar elements, variable inductance means connected between each of said last named terminal connection means and said stator plates of a pair of said variable capacitors, variable trimmer capacitor means connected between said stator plates and a conductive wall, means providing connections for the rotor plates of said variable capacitors with said frame as a common terminal therefor, means connecting said intercepted ultra-high frequency signals with one of said terminals, means providing signal mixing means connected with the other of said terminals, oscillator means for generating a source of signals of a predetermined frequency connected with said mixer, whereby the ultra-high frequency signals are heterodyned with the signals from said source, and means connecting at least one of said parallel plate type variable capacitors with said oscillator as a frequency determining means therefor, utilization means connected with said mixer.

13. In a superheterodyne receiver as defined in claim 9, wherein said variable inductance means comprises an elongated strip of conductive material, one end of said conductive strip connected with said stator plate, the other end of said strip having an aperture for receiving an elongated member having a head portion, said elongated member connected electrically for axial movement with said means providing terminal connection to provide a variable conductive path from said stator plate to said terminal connection, and spring means surrounding said last named member for urging said conductive strip into contact with said head portion.

14. A resonant circuit structure tunable over a predetermined portion of the ultra-high frequency range comprising, a frame including a conductive base member and conductive walls extending in contact with said base, at least one parallel plate type variable capacitor disposed between a pair of said conductive walls, a conductive bar element located in spaced relation to the base and extending between and connecting said walls, means providing a terminal connection on said conductive bar member, inductance means connected between said last named terminal means and one of the plates of said variable capacitor, and means providing connection from another of said capacitor plates with said frame of said structure.

15. A resonant circuit structure tunable over a predetermined portion of the ultra-high frequency range comprising the frame including a conductive base member and conductive walls extending in contact with said base member, at least one parallel plate type variable capacitor disposed between a pair of said conductive walls, a conductive bar element located in spaced relation to said base and extending between and conductively connecting said walls, means providing a terminal connection on said conductive bar member, circuit connections between said last named terminal means and one of the plates of said variable capacitor, and means providing connections from another of said capacitor plates with the frame of said structure.

16. An ultra-high frequency filter structure comprising, a frame including a conductive base member and parallel conductive walls extending in contact with and transverse to said base, a pair of parallel plate type variable capacitors each having terminal connection means and disposed in different spaces between said conductive walls, a pair of conductive bar elements located in spaced relation to the base and extending between and connecting said walls, means providing a terminal connection on each of said conductive bar members, variable inductance means connected between each of said last named terminal means and a terminal connection of said variable capacitors, additional variable capacitance means connected between said last named terminal connection for said variable capacitors to said frame, and means providing connections for the other terminals of said capacitors with said frame as a common terminal means therefor.

17. An ultra-high frequency filter structure as defined in claim 16 wherein said parallel plate type variable capacitors are ganged together, and each have notched rotor plates.

References Cited in the file of this patent

UNITED STATES PATENTS

| | | |
|---|---|---|
| 2,272,062 | George | Feb. 3, 1942 |
| 2,341,345 | Van Billiard | Feb. 8, 1944 |
| 2,344,689 | Frazier | Mar. 21, 1944 |
| 2,422,454 | Weiss | June 17, 1947 |
| 2,459,493 | Bradford et al. | Jan. 18, 1949 |
| 2,521,963 | Beusman | Sept. 12, 1950 |
| 2,563,413 | Ostrow | Aug. 7, 1951 |
| 2,711,477 | Bussard | June 21, 1955 |